(12) United States Patent
Kappes

(10) Patent No.: US 6,369,653 B1
(45) Date of Patent: Apr. 9, 2002

(54) APPARATUS AND METHODS FOR IMPROVED CONTROL OF QUIESCENT STATE OF OUTPUT TRANSISTORS IN A CLASS AB AMPLIFIER

(75) Inventor: Michael S. Kappes, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/566,745

(22) Filed: May 9, 2000

(51) Int. Cl.$^7$ ................................................ H03F 3/26
(52) U.S. Cl. ...................... 330/267; 330/264; 330/268; 330/269; 330/273; 330/274; 330/277; 330/288; 330/296
(58) Field of Search .......................... 330/264, 267, 330/268, 269, 273, 274, 277, 288, 296

(56) References Cited

U.S. PATENT DOCUMENTS 5,654,672 A    8/1997  Bailey et al. ............... 330/289
5,825,246 A *  10/1998 Koifman et al. ............ 330/267

FOREIGN PATENT DOCUMENTS

JP        5331940    *  3/1978

OTHER PUBLICATIONS

Hogervorst et al., "A Compact Power–Efficient 3 V CMOS Rail–to–Rail Input/Output Operational Amplifier for VLSI Cell Libraries", IEEE Journal of Solid State Circuits, vol. 29, No. 12, Dec. 1994, pp. 1505–1512.

Dennis M. Monticelli, "A Quad CMOS Single–Supply Op Amp with Rail–to–Rail Output Swing", IEEE Journal of Solid–State Circuits, vol. sc–21, No. 6, Dec. 1986, pp. 1026–1034.

Huijsing et al., "Low–Power Low–Voltage VLSI Operational Amplifier Cells", IEEE Transactions on Circuits and Systems–I: Fundamental Theroy and Applications, vol. 42, No. 11, Nov. 1995.

* cited by examiner

Primary Examiner—Michael B Shingleton
(74) Attorney, Agent, or Firm—Seed IP Law Group, PLLC

(57) ABSTRACT

A class AB amplifier biasing circuit is provided for controlling the quiescent state of a pull-up output device and a complimentary pull-down output device. The biasing circuit includes first and second current sources, each having a floating resistor configured to supply current to the pull-up and pull-down devices, respectively. The biasing circuit also includes gate control circuits for controlling the gate voltages of the first and second floating resistors. A device replica transistor is connected to a voltage node associated with the gate of the either the pull-up device or the pull-down device.

20 Claims, 6 Drawing Sheets

Indirect Quiescent Bias Servo

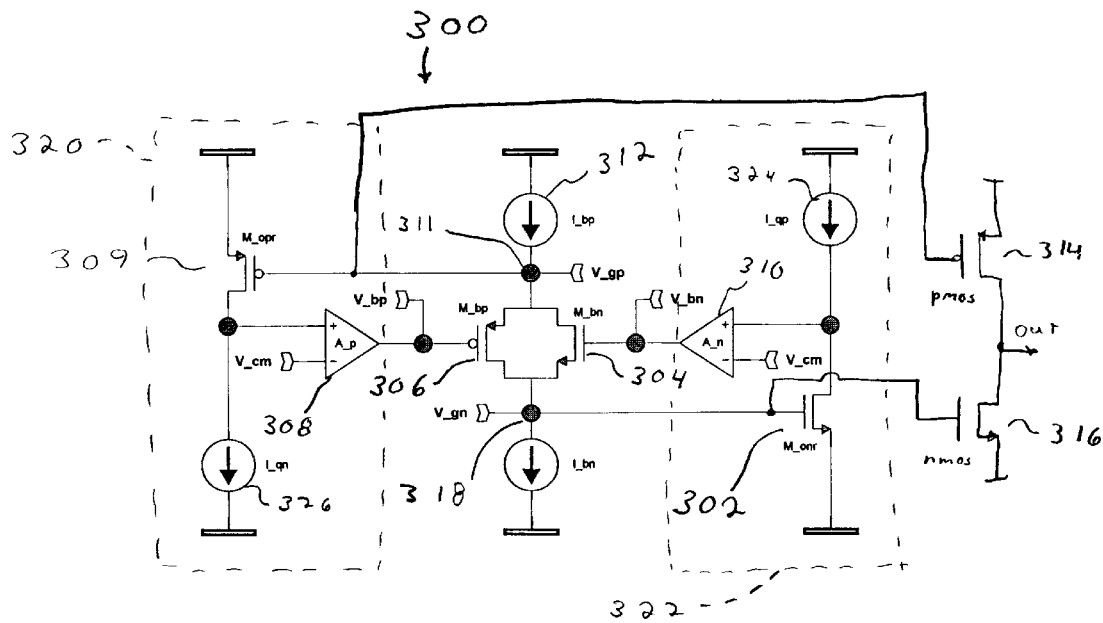
Figure 3. Direct Quiescent Bias Servo
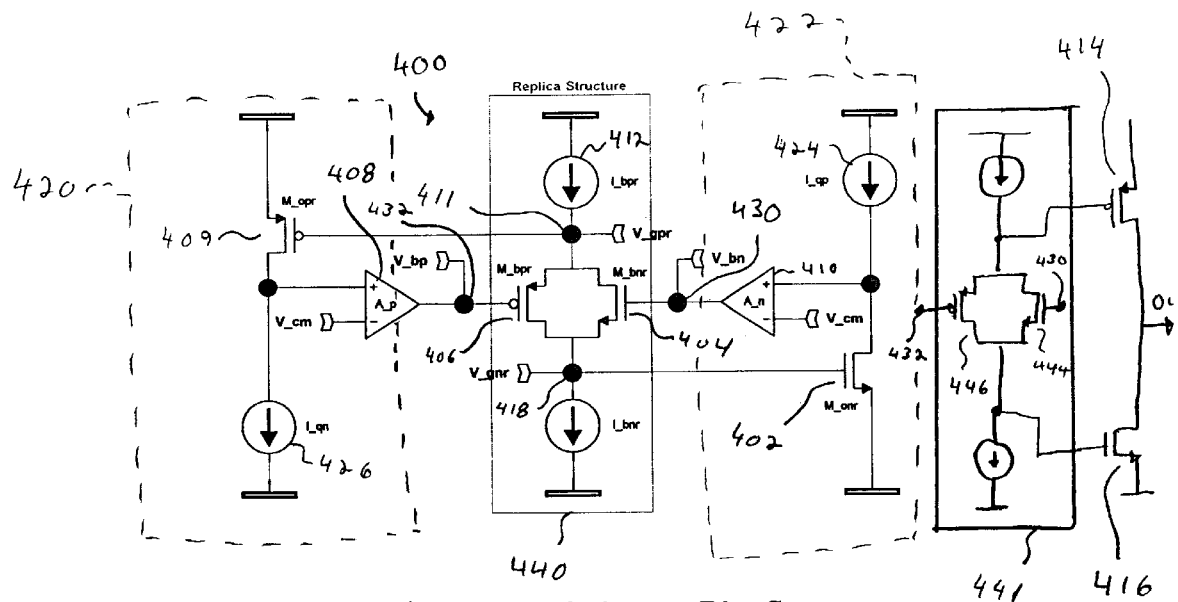
Figure 4. Indirect Quiescent Bias Servo

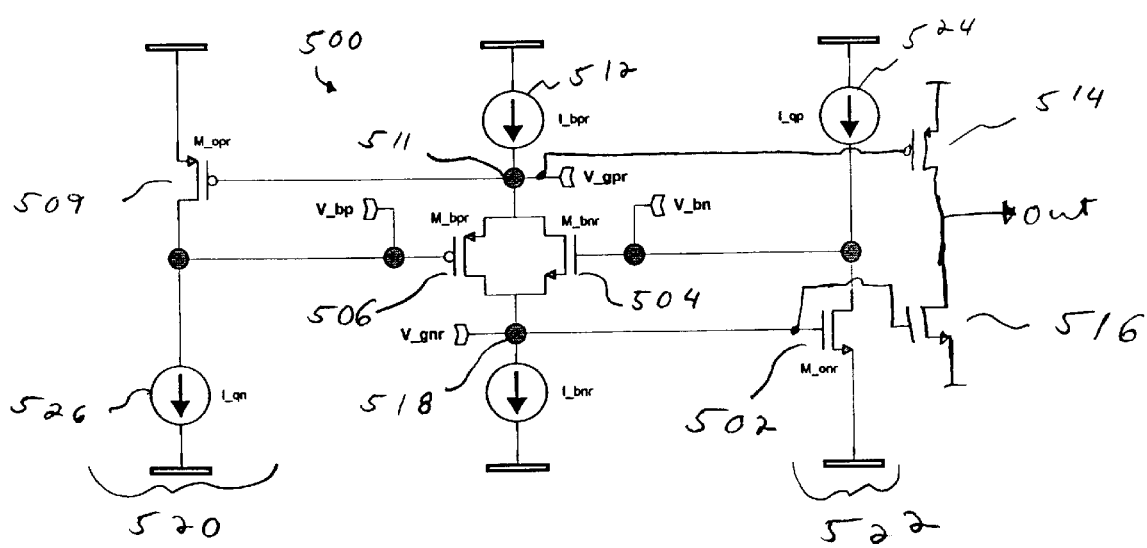
Figure 5  Reduced Form Quiescent Bias Servo

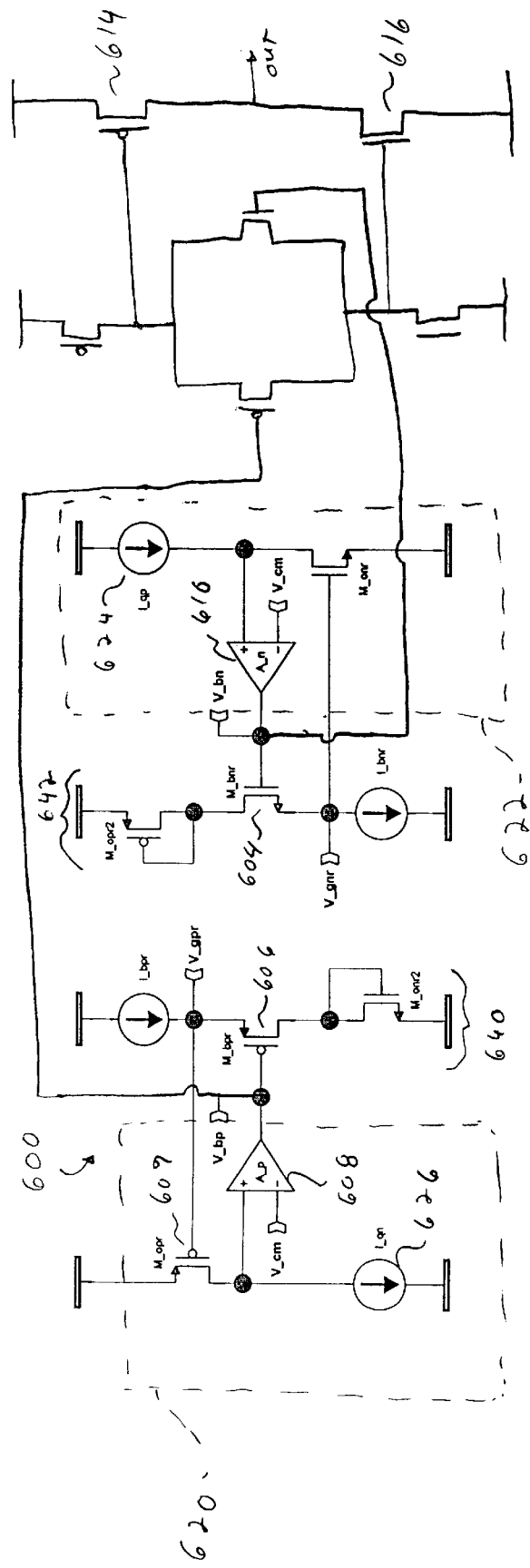
Figure 6 De-coupled Quiescent Bias Servo

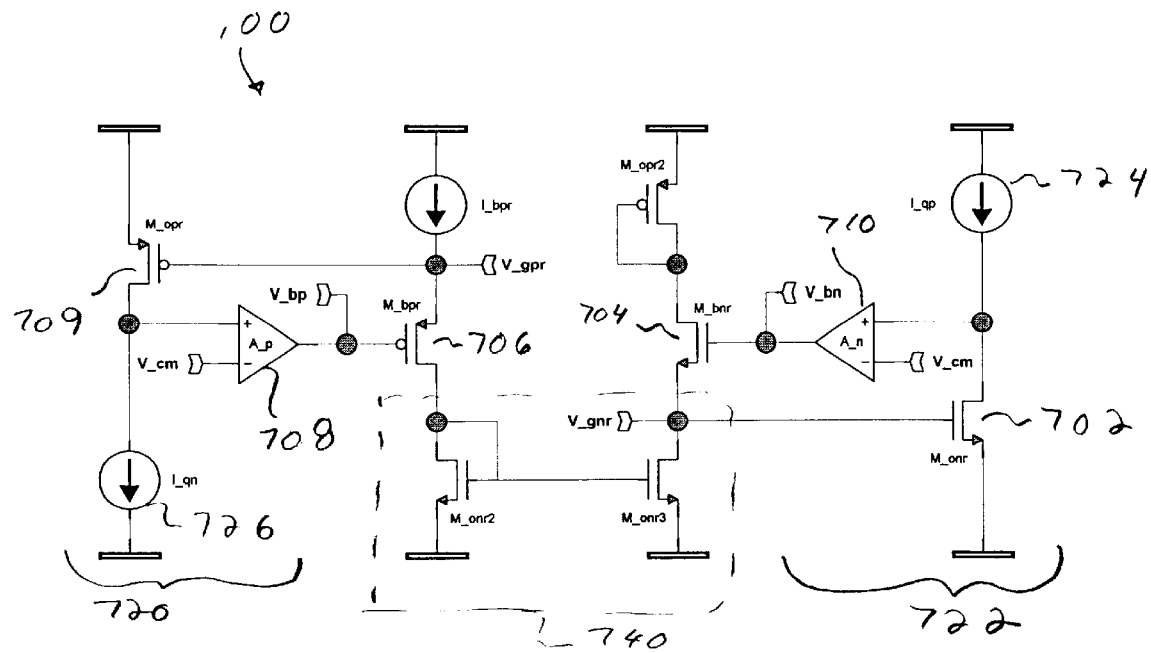
Figure 7 NMOS-Coupled Quiescent Bias Servo
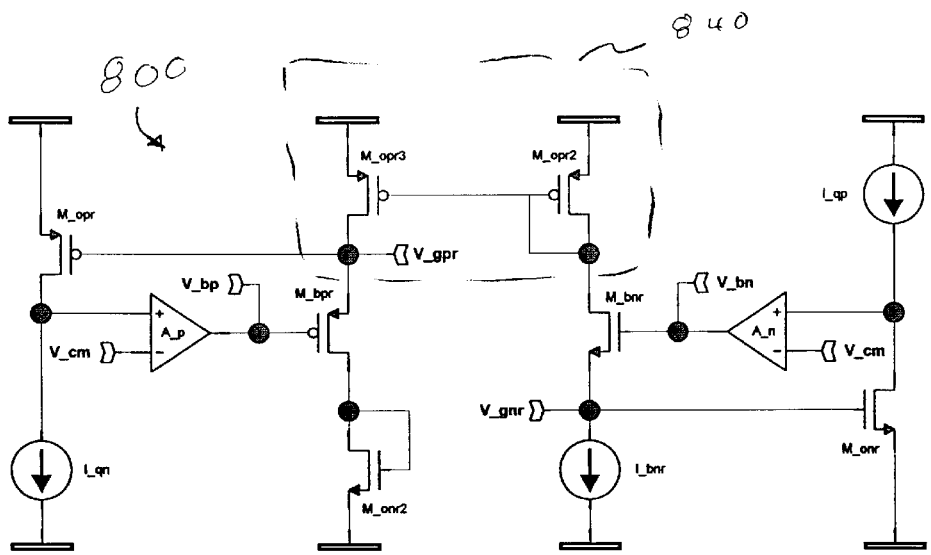
Figure 8 PMOS-Coupled Quiescent Bias Servo

APPARATUS AND METHODS FOR IMPROVED CONTROL OF QUIESCENT STATE OF OUTPUT TRANSISTORS IN A CLASS AB AMPLIFIER

BACKGROUND OF THE INVENTION

1. Technical Field

The present invention relates, generally, to amplifier biasing, and more particularly to circuit topologies for biasing an amplifier output stage for Class A, Class B or Class AB operation to achieve accurate quiescent control at the output stage, to thereby conserve power and maintain enhanced device linearity.

2. Background Art and Technical Problems

The output stage of an amplifier provides a low output resistance that enables output signal delivery to a load with minimal loss of gain. While it is the primary function of the output stage to generate the output signal with minimal loss, it is also desirable to efficiently produce the output signal with minimal total harmonic distortion (THD). This implies that the power dissipated by the output stage is minimized, while providing suitable device linearity.

In order to meet the various efficiency and linearity requirements for a given application, various biasing schemes have been proposed that are generally classified according to the collector current that results when an input signal is applied. These biasing schemes include Class A, Class B, Class C, and Class AB biasing. Class AB biasing techniques are generally desirable for applications which involve driving low ohmic loads, inasmuch as power dissipation under quiescent conditions and crossover distortion are both minimized. In order to fully exploit the Class AB biasing schemes, however, precise control of the quiescent current to the output transistors is required in a wide variety of operating conditions. However, as amplifiers are often composed of at least two stages that are internally compensated, precise control of the output load transistors becomes a difficult and complex task.

Prior art attempts to control the quiescent current through the output transistors in a Class AB amplifier have involved creating a replica of the output device, and to measure and control the quiescent current through the replica device. In this way, precise control of the output device transistor quiescent current may be achieved, to the extent the various factors influencing the quiescent current through the actual output device can be accurately replicated in the replica device.

Presently known techniques for accurately controlling output device quiescent current have thus far been unsatisfactory, in part due to the difficulty associated with appreciating and replicating the relevant operating parameters of the output devices in the context of replica devices.

For a broader discussion of Class AB amplifier biasing techniques, see the following references, the entire contents of which are hereby incorporated by reference: Bailey, et al., U.S. Pat. No. 5,654,672, issued Aug. 5, 1997, entitled "Precision Bias Circuit for a Class AB Amplifier"; "A Compact Power-Efficient 3 V CMOS Rail-to-Rail Input/Output Operational Amplifier for VLSI Cell Libraries", by Hogervorst, et al., in the December 1994 IEEE; "A Quad CMOS Single-Supply OP Amp with Rail-to-Rail Output Swing", by Monticelli, in the December 1986 IEEE; and "Low-Power Low-Voltage VLSI Operational Amplifier Cells", by Huijsing, et al., in the November 1995 IEEE.

Methods and apparatus are thus needed for improving the parameters associated with replica devices, to thereby enhance the quiescent control of the output stage in Class AB amplifiers, which overcome the shortcomings of the prior art.

SUMMARY OF THE INVENTION

The present invention provides improved methods and apparatus for controlling the quiescent current through output devices. In accordance with a preferred embodiment of the present invention, a gate control circuit is provided which controls the gate of a "floating resistor" transistor, to thereby precisely control the quiescent current of the output devices. In accordance with a particularly preferred embodiment, a gate control circuit includes a replica transistor, wherein the replica device sees the same drain source conditions as the output device. In accordance with a further aspect of this embodiment, a current source is employed to source the output replica device independent of any other replica devices.

In accordance with a further aspect of the present invention, a gate current control circuit is provided which includes a replica device which shares a common gate voltage node with its corresponding output device, as well as an amplifier for directly controlling the gate voltage of the floating resistor.

In accordance with an alternate embodiment of the present invention, an indirect quiescent bias servo circuit is provided which includes a primary floating resistor network, the output of which directly controls the gates of the output devices; in addition, the indirect quiescent bias servo circuit includes a replica structure of the primary floating resistor network, wherein the output of the replica structure is used to control the gates of the output replica devices. In accordance with a further aspect of this embodiment, the gate control circuit for controlling the floating resistor of the replica floating resistor structure includes an amplifier having an output configured to directly control the gate voltage of the floating resistor in the replica floating resistor structure.

In accordance with a further aspect of the present invention, a reduced form quiescent bias servo circuit is provided, wherein the gate control circuit includes an output replica device having its gate tied to the same voltage node as the gate of its corresponding output device. In accordance with a further aspect of the reduced form embodiment, only a single replica device (the output replica device) is provided, which allows the reduced form servo circuit to operate effectively in a 3-volt environment.

In accordance with a further aspect of the present invention, a decoupled quiescent bias servo circuit is provided which includes a first floating resistor transistor configured to control the gate voltage of a first output device, and a second floating resistor decoupled from the first floating resistor and configured to control the gate voltage of the complimentary output device. In accordance with this decoupled embodiment, problems associated with the unequal affects of current sources and other affects on the two complimentary floating resistors are eliminated.

In accordance with a further aspect of the present invention, an NMOS-coupled quiescent bias servo circuit is provided which further enhances the decoupled servo circuit by providing an NMOS current mirror to ensure correspondence between the current used to drive the first floating resistor and the current used to drive the second floating resistor which is decoupled from the first floating resistor.

In accordance with a further aspect of the present invention, a PMOS-coupled quiescent bias servo circuit is provided which includes a PMOS current mirror to provide current to the decoupled floating resistor transistors.

BRIEF DESCRIPTION OF THE DRAWING FIGURES

The present invention will hereinafter be described in conjunction with the appended drawing figures, wherein like numerals denote like elements, and:

FIG. 3 is an electrical schematic diagram of a floating resistor network, including respective floating resistor gate control circuits in accordance with a preferred embodiment of the present invention;

FIG 4 is an electrical schematic diagram of an indirect quiescent bias servo circuit showing a primary floating resistor circuit for controlling the gate voltages of the output devices, and a replica floating resistor structure configured to control the gate voltages of output replica devices;

FIG. 5 is an electrical schematic diagram of a reduced form quiescent bias servo circuit in accordance with the present invention;

FIG. 6 is an electrical schematic diagram of a decoupled quiescent bias servo circuit in accordance with the present invention;

FIG. 7 is an electrical schematic diagram of an NMOS-coupled quiescent bias servo circuit employing an NMOS current mirror; and FIG. 8 is an electrical schematic diagram of a PMOS-coupled quiescent bias servo circuit employing a PMOS current mirror in accordance with the present invention.

DETAILED DESCRIPTION OF PREFERRED EXEMPLARY EMBODIMENTS

Figure 1:
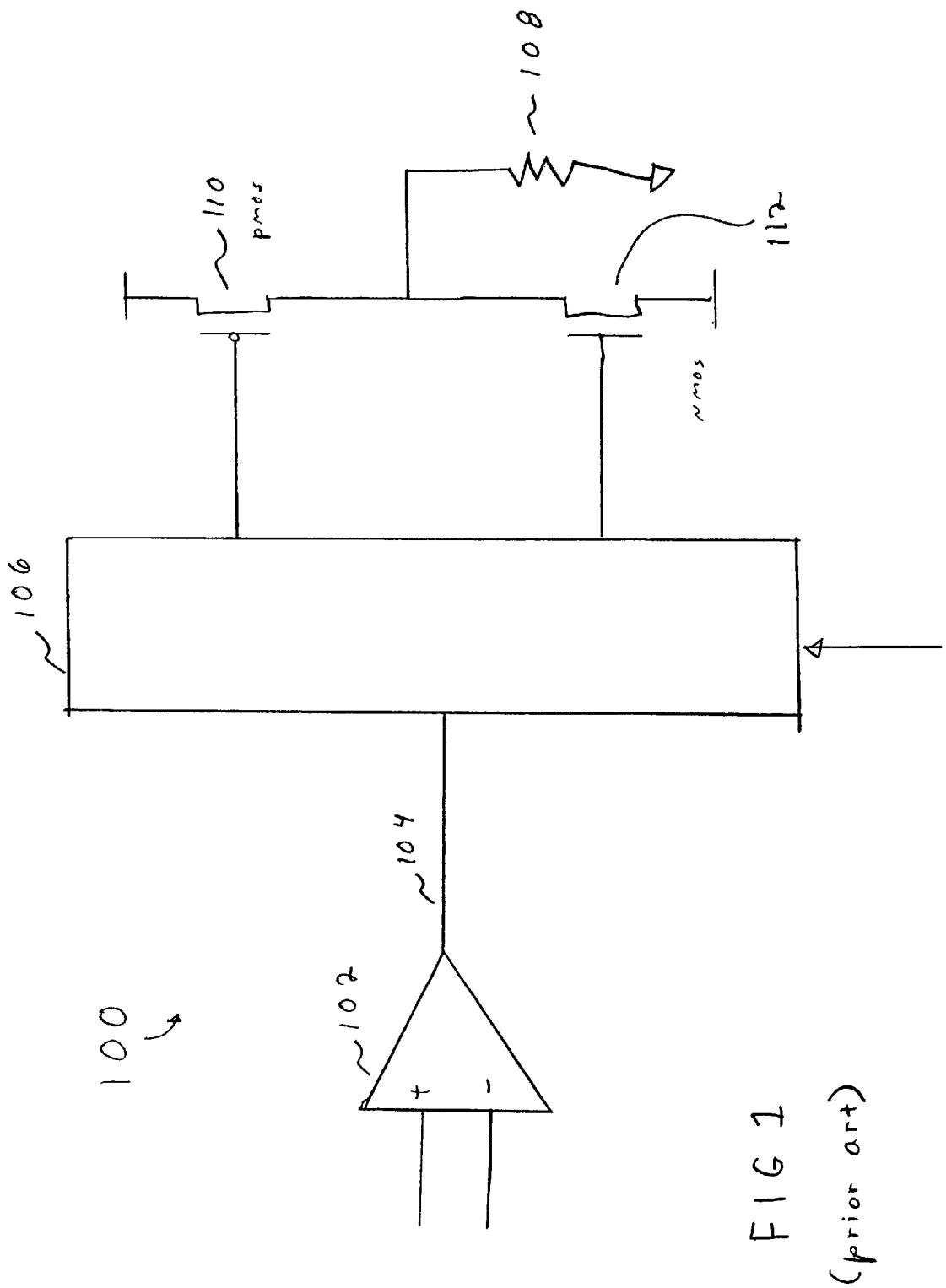
FIG. 1 is a schematic block diagram of a signal driver, a coupling circuit, and output devices shown driving a resistive load.

Referring now to FIG. 1, a block diagram of a typical prior art Class AB amplifier 100 suitably comprises a common source amplifier 102 having an output 104 applied through a coupler stage 106 to an output load 108. In the context of the present invention, output load 108 may be any device driven by a Class A, Class B, or Class AB amplifier, for example an audio speaker, a line driver for telecommunications equipment, or the like. Current is supplied to the output load 108 by a pair of complementary device transistors, namely, a PMOS or pull-up device transistor 110 and an NMOS or pull-down transistor 112. One of the principle functions of coupler circuit 106 is to precisely control the gate voltages to transistors 110 and 112, such that transistor 110 remains in the quiescent state while transistor 112 is pulled down, and such that transistor 112 is maintained in its quiescent state during the period in which transistor 110 is being pulled up.

Figure 2:
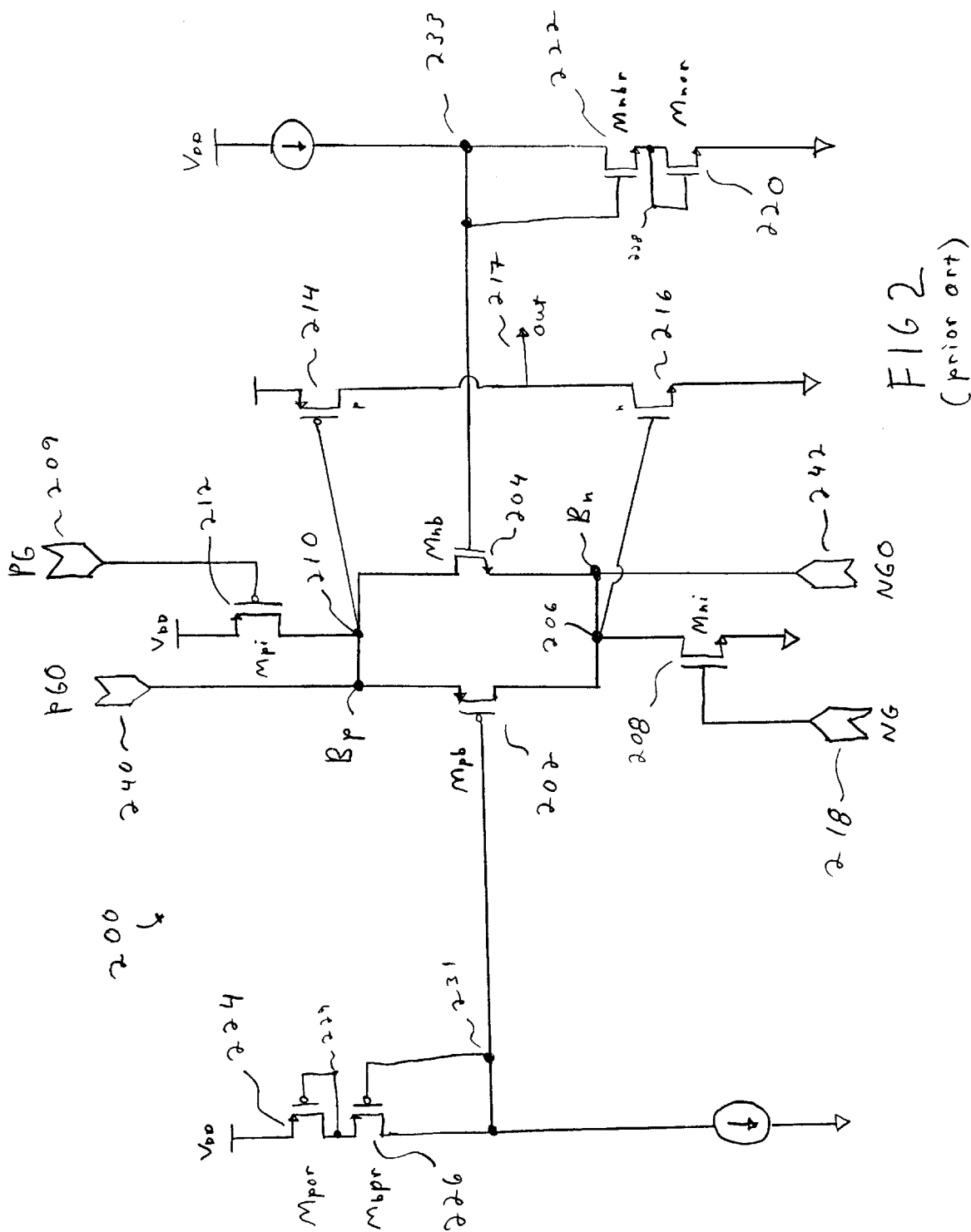
FIG. 2 is a schematic block diagram of a prior art floating resistor network configured to control the gate voltages of complimentary output devices, and further illustrating conventional floating resistor gate control circuits comprising stacked transistors.

Referring now to FIG. 2, an exemplary prior art coupling circuit 200 is configured to apply a data signal to an output load 217 through an NMOS device 214 and a PMOS device 216. The input signal, or data signal, is alternately applied at respective input sources 209 and 218, as is known in the art. Specifically, the "pull-up" portion of the input signal applied at input source 209 modulates the gate of $M_{pi}$ transistor 212, while the input signal applied at input source 218 modulates the gate of $M_{ni}$ transistor 208. Bias voltage for output device 214 is supplied by a voltage source 240, and quiescent bias voltage for output device 216 is supplied by a voltage source 242.

Precise quiescent control of the current through respective output devices 214 and 216 is largely managed by what is known in the art as a floating resistor network, shown in FIG. 2 as comprising an $M_{pb}$ transistor 202 and an Mnb transistor 204. As discussed in greater detail below, a key factor in precisely controlling the quiescent current through output devices 214 and 216 involves precise control of the voltage $B_p$ at node 210 and voltage $B_n$ at node 206, respectively. Respective bias voltages $B_p$ and $B_n$, in turn, are precisely maintained by modulating the gate voltages at transistors 202 and 204, respectively.

With continued reference to FIG. 2, during quiescent operation of coupling circuit 200, i.e., when no data signal is being applied at signal inputs 209 and 218, device transistors 214 and 216 desirably operate in their quiescent state, that is, only enough voltage is applied to their respective gates to keep them barely turned on, while at the same time minimizing the power consumption associated with these devices. By maintaining device transistors 214 and 216 in the "barely on" or quiescent state, the non-linearities and other disruptive transients associated with turning them on and off (as is the case in Class B operation) may be substantially reduced. Moreover, by maintaining output transistors 214 and 216 in their quiescent state, as opposed to keeping them fully turned on (as is the case in Class A amplifier operation), power is conserved. Thus, Class AB bias techniques exploit the principle advantages of both Class A operation and Class B operation, while minimizing the draw backs associated with Class A and Class B operations.

When a data signal is applied to respective input sources 209 and 218, the gate voltages at transistors 208 and 212 are modulated in accordance with the input signal, as is known in the art. In this way, transistors 208 and 212 effectively function as current sources, thereby modulating the respective voltage levels at nodes 210 and 206, respectively. The "modulation" of the voltage levels $B_p$ and $B_n$ modulate the gate voltages at device transistors 214 and 216, respectively, thereby alternately "pulling up" and "pulling down" device transistors 214 and 216, which replicates the input signal at the output load 217. The manner in which the floating resistor network precisely controls the quiescent voltage at the gates of device transistors 214 and 216 will now be described.

With continued reference to FIG. 2, and in accordance with well known prior art techniques, output device 216 is suitably replicated as an $M_{nor}$ transistor 220 (similarly, output device 214 is suitably replicated as an $M_{por}$ transistor 224). In this context, those skilled in the art will appreciate that the replica devices 220 and 224 are not necessarily scaled 1-to-1 with respect to the actual output devices 216 and 214; rather, replica devices are typically implemented in a scaled fashion, with the relevant electronic parameters typically being scaled on the order of 2-to-1 up to 100-to-1 or greater. By properly designing replica device 220, the voltage at the gate of replica device 220, namely voltage node 228, is desirably maintained the same as (or as a scaled value of) the voltage level at node 206 ($B_n$); similarly, the voltage at the gate of replica device 224 (node 229) is suitably maintained the same as (or the scaled equivalent of) voltage node 210 ($B_p$).

In order to complete the control circuit for controlling the gates of the "floating resistors" 202 and 204, $M_{nb}$ transistor 204 is also replicated as $M_{nbr}$ transistor 222 (either identically or as a scaled ratio); similarly, $M_{pb}$ transistor 202 is replicated as $M_{pbr}$ transistor 226 (either identically or as a scaled ratio). In this way, the gate voltage applied to "floating resistor" transistor 204, namely, the voltage at node 233, is the same voltage which is applied to the replica of that floating resistor, namely, replica transistor 222. This voltage at node 233 is thus maintained at one transistor voltage ($V_t$) above node 206 ($B_n$). Moreover, the voltage level at node 206, which is the voltage level applied to the gate of device transistor 216, is made to closely approximate the gate voltage (node 228) applied to device replica transistor 220, inasmuch as voltage node 206 and voltage node 228 are both intended to be maintained at approximately $1V_t$ above ground.

In similar fashion, the voltage applied to the gate of "floating resistor" 202 (namely, the voltage at node 231) is the same voltage which is applied to the gate of replica transistor 226. In this way, the voltage applied to the gate of device transistor 214 (namely, voltage node 210) closely approximates (either identically or as a scaled factor) the voltage applied to the gate of device replica resistor 224, namely, the voltage at node 229.

The foregoing prior art scheme for replicating the device transistors and the floating resistor transistors has worked reasonably well, but has been found to be unsatisfactory for several reasons. In the first instance, those skilled in the art will appreciate that the gate-source voltage VGS is not necessarily determined solely as a function of the gate-to-source voltage of a transistor. In addition, the drain-to-source voltage may vary from transistor to transistor, even when those transistors are intended to "see" the same operating conditions. Thus, it is known that even properly designed replica devices do not necessarily correspond exactly to the devices which they are intended to replicate, for example because the replica devices do not necessarily experience the same drain-to-source voltage as the device being replicated.

The present inventor has determined that even slight mismatches between the drain source conductance of a replica device and the corresponding drain source conductance of the device being replicated can result in systematic errors in the quiescent current through the output devices.

In accordance with one aspect of the present invention, the replica devices are configured to more closely approximate the drain source conductance associated with the corresponding device being replicated, thereby providing enhanced quiescent control of the output devices.

Referring now to FIG. 3, a direct quiescent bias servo circuit 300 suitably comprises respective floating resistors 304 and 306 (generally analogous to floating resistors 204 and 202 of FIG. 2). Transistor 304 is configured to control the voltage level voltage node 318 (generally analogous to voltage node 206 of FIG. 2). Transistor 306 is configured to control the voltage level at voltage node 311 (voltage node 311 is generally analogous to voltage node 210 of FIG. 2). The voltage level at node 318 is applied to the gate of the NMOS output device 316, and the voltage level at node 311 is applied to and controls the gate at PMOS output device 314, in a manner generally analogous to the control scheme described above in connection with FIG. 2.

With continued reference to FIG. 3, precise quiescent control of output devices 314 and 316 is accomplished by precisely controlling the gate voltages at floating resistors 306 and 304, respectively. With momentary reference to FIG. 2, recall that the gate voltage of floating resistor 204 was controlled by respective stacked replica transistors 220 and 222, and that the gate voltage of floating resistor 202 was controlled by the stacked replica transistors 224 and 226. In accordance with the embodiment shown in FIG. 3, the gate voltage of floating resistor 304 is suitably controlled by a first gate control circuit 322, and the voltage applied to the gate of floating resistor 306 is suitably controlled by a second gate control circuit 320. Respective gate control circuits 320 and 322 generally function in the same manner; hence, for clarity, the operation of gate control circuit 322 will be described in detail, it being understood that the same description generally applies to control circuit 320.

With continued reference to FIG. 3, the "stacked" transistor paradigm of FIG. 2 is replaced with a device replica transistor 302 and an amplifier 310. In this way, a current source 324 may be employed to directly control the current through output replica device 302. Moreover, the gate voltage applied to replica device 302 is precisely the same gate voltage applied to output device 316, which allows replica device 302 to more closely approximate the actual operating conditions experienced by output device 316. Moreover, by breaking apart the replica devices so that they are no longer stacked in series (as was the case with replica devices 220 and 222 in FIG. 2), the arrangement shown in gate control circuit 322 allows for the creation of a feedback loop to control the drain source voltage of replica device 302 independent of amplifier 310.

Amplifier 310 generally drives its positive and negative inputs to be at the same level. By applying a common mode voltage to the negative input of amplifier 310, the drain voltage at replica device 302 is thereby driven to also be at common mode voltage, which corresponds to the quiescent point of output device 316. Moreover, the output of amplifier 310 is advantageously configured to directly control the gate of transistor 304.

The control circuit shown in FIG. 3 is particularly advantageous in that the gate voltages of replica device 302 and output device 316 are nearly precisely the same. Moreover, replica device 302 experiences the same drain voltage as output device 316 to the extent a common mode voltage is controlling amplifier 310. Thus, the quiescent current of the output device 316 should very precisely approximate the quiescent current through replica device 302. The control scheme shown in FIG. 3 is suitably referred to as the "direct servo" configuration inasmuch as the gate voltage of replica device 302 directly senses the same gate voltage as its corresponding output device 316.

Referring now to FIG. 4, an indirect quiescent bias servo scheme is employed in accordance with an alternate embodiment of the present invention.

Referring now to FIG. 4, an indirect quiescent bias servo circuit 400 suitably comprises respective floating resistors 404 and 406 (generally analogous to floating resistors 304 and 306 of FIG. 3), and respective gate control circuits 422 and 420 (generally analogous to respective gate control circuits 322 and 320 of FIG. 3). Gate control circuit 422 suitably functions in a manner analogous to that described above in connection with gate control circuit 322 of FIG. 3, and gate control circuit 420 suitably functions in a manner analogous to that described above with respect to gate control circuit 320 of FIG. 3. More particularly, gate control circuit 422 suitably comprises a device replica transistor 402, an amplifier 410, and a current source 424 for directly controlling the current through device replica transistor 402 (as with FIG. 3, gate control circuit 420 is generally analogous in structure and function to gate control circuit 422).

Significantly, although the output of amplifier 410 is advantageously configured to be applied to (and hence control) the gate voltage of floating resistor 404 (and the output of amplifier 408 is applied to the gate of transistor 406), the voltages applied to the gates of replica transistors 402 and 409 are not the same voltage nodes which control the gate voltages of corresponding device transistors 416 and 414, respectively.

More particularly, in the indirect servo technique shown in FIG. 4, a floating resistor network 441 is advantageously configured to control the gate voltages of output devices 414 and 416, generally in the manner described in connection with FIG's 2 and 3. However, in contrast to the embodiment shown in FIG. 3, the gate voltage applied to output devices 414 and 416 is not literally applied to the gates of their corresponding replica devices; rather, the entire floating resistor network 441 is replicated as replica floating resistor network 440 to thereby control the gate voltages of the replica devices which correspond to output devices 414 and 416, namely replica devices 409 and 402. Although replica structure 440 increases the hardware requirements for circuit 400 vis-a-vis the embodiment shown in FIG. 3, some important advantages are obtained from replicating the floating resistor network 441 as replica structure 440.

More particularly and with momentary reference to FIG. 3, during quiescent operation, the various gate, drain, and source voltage levels experienced by the output devices and their corresponding replica devices are fairly closely matched. However, once an input signal is applied to circuit 300, the replica devices tend to react somewhat differently than the actual output devices. For example, when an input signal is applied to the circuit of FIG. 3 (for example through input signal current source 312), the floating resistors (304 and 306) are alternately modulated off during wide amplitude swings in the input signal. Conversely, when the input signal settles back to the quiescent state, the outputs of amplifiers 310 and 308 turn both transistors 304 and 306 back on. This results in transients being generated as transistors 304 and 306 are turned on and off, which can adversely affect the quiescent current through the output devices. While this is not a problem in many applications, this could result in high frequency noise, distortion, and other undesirable affects in other applications.

In the embodiment shown in FIG. 4, the output of amplifiers 410 and 408 are operated with constant biasing at steady-state and do not "see" the input signal modulation. The replica circuit (in the indirect case) therefore does not react to the input signal and its bias outputs do not fluctuate.

Referring now to FIG. 5, a reduced form quiescent bias servo circuit 500 suitably comprises a first floating resistor type transistor 504 and a second floating resistor type transistor 506. A first gate control circuit 522 is suitably configured to control the gate voltage at transistor 504; a second gate control circuit 520 is similarly configured to control the gate voltage at transistor 506 in an analogous manner. Gate control circuit 522 suitably comprises a replica transistor 502 which replicates a corresponding output device transistor 516. Gate control circuit 522 further comprises a current source 524 configured to directly apply current through replica device 502.

In the embodiment shown in FIG. 5, the voltage (corresponding to voltage node 518) which is applied to the gate of replica transistor 502 is also applied to the gate of its corresponding output device transistor 516. In similar fashion, the voltage (corresponding to voltage node 511) applied to the gate of replica transistor 509 is also directly applied to its corresponding output device transistor 514. In the embodiment shown in FIG. 5, the amplifiers are omitted such that the drain source voltages of the output and replica devices are no longer precisely matched. In the direct implementation shown in FIG. 5, the gate voltage of the replica devices is tied to the gate voltage of their corresponding output devices.

Alternatively, an indirect reduced form bias servo circuit (not shown) could be employed as a variation of the circuit shown in FIG. 5 by including a separate floating resistor network for the replica devices as well as an exact or substantially similar version of the same floating resistor network to be used for the actual output device transistors (analogous to that shown in FIG. 4), again while omitting the amplifiers and feedback loop. The principle advantage of the reduced form implementation shown in FIG. 5 (and its corresponding indirect method, not shown) resides in the simplicity of the hardware implementation. Although the reduced form embodiment yields similar drain source mismatching issues discussed in connection with FIG. 2, for certain applications (e.g., in the range of 3 volts) the simplicity afforded by the reduced form implementation may be a desirable trade off in view of the relatively limited affects of the drain source mismatching in the 3-volt implementation.

Referring now to FIG. 6, a decoupled quiescent bias servo circuit 600 is shown. In accordance with one aspect of the embodiment shown in FIG. 6, the replica floating resistor circuit (comprising respective floating resistors 604, 606) is suitably broken up into separate legs, such that a single, dedicated floating replica resistor circuit leg 640 is used to drive the bias signal for a P output device 614, and a second, decoupled floating replica resistor circuit leg 642 is employed to drive the bias signal for an N output device 616, there being no direct electrical correlation between the two floating resistor circuit legs.

Referring now to FIG. 7, an NMOS-coupled quiescent bias servo circuit 700 is generally analogous in structure and function to the decoupled servo circuit embodiment of FIG. 6. Recall that the embodiment in FIG. 6 essentially employs a dedicated replica floating resistor leg to bias the P device, and a separate dedicated replica floating resistor leg to bias the N device. However, it is necessary to develop a pull up current in the floating resistor circuit which drives the P output device, and to separately generate a pull down current in the floating resistor circuit used to drive the N output device. Recognizing that mismatching in these two independently developed currents may occur from time to time and perhaps adversely affect the quiescent control of the output devices, it may be desirable to employ a current mirror 740 such that the current generated for the floating resistor circuit which drives the N device is also mirrored in the floating resistor circuit which drives the P device. In this way, the current used to drive the floating resistor for the N output device will be very closely matched with the current used to drive the floating resistor circuit for the P device. In an alternate embodiment shown in FIG. 8, a PMOS-coupled quiescent bias servo circuit 800 is shown, with circuit 800 being generally analogous in structure and function to the embodiment shown in FIG. 7. Notably, a P current mirror 840 is employed in the embodiment shown in FIG. 8 to achieve matching of the current sources in both the floating resistor circuit used to drive the N output device as well as the floating resistor circuit used to drive the P output device.

The foregoing description is of preferred embodiments of the subject invention. It will be appreciated that the foregoing description is not intended to be limiting; rather, the preferred embodiments set forth herein merely set forth exemplary applications of the subject invention. It will be appreciated that various changes, deletions, and additions may be made to the components and steps discussed herein, without departing from the spirit and scope of the invention as set forth in the appended claims.

I claim:

1. A class AB amplifier biasing circuit for controlling the quiescent state of a pull up output device and a complimentary pull down output device, the biasing circuit comprising:
   a) a first current source and a first floating resistor configured to supply quiescent current to said pull up output device;
   b) a second current source and a second floating resistor configured to supply quiescent current to said pull down output device, wherein said first and second floating resistors each comprise a transistor having a gate, drain, and source node;
   c) a first gate control circuit configured to control the gate voltage of said first floating resistor; and
   d) a second gate control circuit configured to control the gate voltage of said second floating resistor;
   wherein at least one of said first and second gate control circuits includes a device replica transistor, the gate of which is connected to a voltage node associated with the gate of one of said pull up device and said pull down output device.

2. The biasing circuit of claim 1, wherein said voltage node is source coupled to one of said first and second floating resistors.

3. The biasing circuit of claim 1, wherein said pull up output device is a PMOS transistor.

4. The biasing circuit of claim 1, wherein said pull down output device is an NMOS transistor.

5. The biasing circuit of claim 1, wherein said at least one gate control circuit further comprises a current source coupled to the drain of said device replica transistor.

6. The biasing circuit of claim 1, wherein said at least one gate control circuit further comprises an amplifier having an output electrically connected to the gate of one of said floating resistors, and further wherein a common mode voltage is applied to an input of said amplifier.

7. The biasing circuit of claim 1, wherein said at least one of said gate control circuits comprises:
   a current source coupled to the drain of said replica device;
   an amplifier having a common mode voltage supply applied to an input thereof, and another input thereto is electrically connected to said replica drain, and further wherein the output of said amplifier is electrically connected to the gate of the floating resistor of said at least one gate control circuit.

8. The biasing circuit of claim 1, wherein said pull up output device comprises a PMOS device, and said pull down output device comprises an NMOS device.

9. The biasing circuit of claim 1, wherein each of said first and second gate control circuits comprises:
   a replica device having a current source connected to the drain thereof; and
   an amplifier having a first input, a second input, and an output, wherein said first input is electrically connected to the drain of said replica device, said second input is connected to a common mode voltage supply, and said output is electrically connected to the gate of said amplifier's associated floating resistor.

10. A method for controlling the biasing of an output transistor device in a class A amplifier, comprising the steps of:
   providing a first output transistor having a gate connected to a first voltage node;
   providing a floating transistor network configured to selectively bias the gate of said first output transistor;
   providing a first replica output transistor having an electrical characteristic which is a predetermined scaled value of said first output transistor device; and
   connecting the gate of said replica output transistor to said first voltage node.

11. The method of claim 10, further comprising the steps of:
   providing a second output transistor having a gate connected to a second voltage node;
   selectively biasing the gate of said second output transistor with said floating transistor network;
   providing a second replica output transistor associated with said second output transistor;
   connecting the gate of said second replica output transistor to said second voltage node.

12. The method of claim 11, further comprising the steps of:
   connecting the respective sources of said first output transistor and said first replica transistor to a common node.

13. A class AB amplifier biasing circuit for biasing the gate of a pull up output device and a complimentary pull down output device, comprising:
   a current source connected to a floating transistor network, said current source being representative of an output signal to be applied to said output devices;
   a replica floating transistor network, having an electrical characteristic which is a scaled value of a corresponding electrical characteristic of said floating transistor network; and
   a first control circuit configured to apply a first control signal to the gate of a first transistor associated with said replica floating transistor network and to the gate of a second transistor associated with said floating transistor network, wherein
   said control circuit comprises an operational amplifier configured to output said control signal.

14. The biasing circuit of claim 13, wherein a common mode signal is applied to an input of said operational amplifier.

15. A class AB amplifier biasing circuit for biasing the gate of a pull up output device and a complimentary pull down output device, comprising:
   a current source connected to a floating transistor network, said current source being representative of an output signal to be applied to said output devices;
   a replica floating transistor network, having an electrical characteristic which is a scaled value of a corresponding electrical characteristic of said floating transistor network;
   a first control circuit configured to apply a first control signal to the gate of a first transistor associated with said replica floating transistor network and to the gate of a second transistor associated with said floating transistor network; and
   a second control circuit configured to apply a second control signal to the gate of a third transistor associated with said replica floating transistor network and to the gate of a fourth transistor associated with said floating transistor network;

wherein said first control circuit comprises a first operational amplifier configured to output said first control signal, and said second control circuit comprises a second operational amplifier configured to generate said second control signal.

16. The biasing circuit of claim 15, wherein the gates of said pull up and pull down output devices, respectively, are electrically connected to and biased by the drain/source nodes of said floating transistor network.

17. The biasing circuit of claim 15, wherein said replica floating transistor network comprises:

a first circuit leg comprising said first replica floating transistor; and a second circuit leg comprising said third replica floating transistor electrically decoupled from said first replica floating transistor.

18. The biasing circuit of claim 17, wherein said first circuit leg comprises a replica current source, and said replica floating transistor network comprises a current mirror configured to mirror the current from said replica current source to said second circuit leg.

19. The biasing circuit of claim 18, wherein said current mirror comprises a NMOS-coupled current mirror.

20. The biasing circuit of claim 18, wherein said current mirror comprises a PMOS-coupled current mirror.

* * * * *